(12) United States Patent
Lan et al.

(10) Patent No.: US 11,437,367 B2
(45) Date of Patent: Sep. 6, 2022

(54) HETEROGENEOUS INTEGRATED WIDEBAND HIGH ELECTRON MOBILITY TRANSISTOR POWER AMPLIFIER WITH A SINGLE-CRYSTAL ACOUSTIC RESONATOR/FILTER

(71) Applicant: QUALCOMM Incorporated, San Diego, CA (US)

(72) Inventors: Je-Hsiung Lan, San Diego, CA (US); Ranadeep Dutta, Del Mar, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 162 days.

(21) Appl. No.: 16/854,313

(22) Filed: Apr. 21, 2020

(65) Prior Publication Data

US 2021/0327873 A1   Oct. 21, 2021

(51) Int. Cl.
| | |
|---|---|
| *H01L 29/778* | (2006.01) |
| *H01L 27/06* | (2006.01) |
| *H01L 29/20* | (2006.01) |
| *H01L 29/66* | (2006.01) |
| *H03F 3/213* | (2006.01) |

(52) U.S. Cl.
CPC ...... *H01L 27/0688* (2013.01); *H01L 29/2003* (2013.01); *H01L 29/66462* (2013.01); *H01L 29/778* (2013.01); *H03F 3/213* (2013.01)

(58) Field of Classification Search
CPC ............... H01L 23/66; H01L 29/66431; H01L 29/66462; H01L 29/778–7789; H01L 27/20; H01L 41/00–47; H03H 3/02–10; H03H 3/125–145; H03H 3/17–205; H03H 3/54–64

See application file for complete search history.

(56) References Cited

U.S. PATENT DOCUMENTS

| | | | |
|---|---|---|---|
| 2004/0173816 A1 | 9/2004 | Saxler | |
| 2008/0169474 A1* | 7/2008 | Sheppard | ........... H03H 9/02574 |
| | | | 257/E27.014 |
| 2014/0361371 A1 | 12/2014 | Comeau et al. | |

(Continued)

FOREIGN PATENT DOCUMENTS

| | | |
|---|---|---|
| CN | 105141278 B | 5/2018 |
| CN | 110380702 A | 10/2019 |

OTHER PUBLICATIONS

Ansari A., "Gallium Nitride Integrated Microsystems for Radio Frequency Applications", University of Michigan 2016, 178 Pages.

(Continued)

*Primary Examiner* — Eric A. Ward
(74) *Attorney, Agent, or Firm* — Qualcomm Incorporated

(57) ABSTRACT

A 3D integrated circuit (3D IC) chip is described. The 3D IC chip includes a die having a compound semiconductor high electron mobility transistor (HEMT) active device. The compound semiconductor HEMT active device is composed of compound semiconductor layers on a single crystal, compound semiconductor layer. The 3D IC chip also includes an acoustic device integrated in the single crystal, compound semiconductor layer. The 3D IC chip further includes a passive device integrated in back-end-of-line layers of the die on the single crystal, compound semiconductor layer.

16 Claims, 13 Drawing Sheets

(56) References Cited

U.S. PATENT DOCUMENTS

| | | | |
|---|---|---|---|
| 2014/0367777 A1* | 12/2014 | Huang | H01L 29/7816 |
| | | | 438/459 |
| 2015/0255368 A1 | 9/2015 | Costa | |
| 2016/0190206 A1 | 6/2016 | Tsai et al. | |
| 2017/0373026 A1 | 12/2017 | Goktepeli | |
| 2018/0247933 A1 | 8/2018 | Yang et al. | |
| 2020/0119087 A1* | 4/2020 | Then | H01L 41/314 |
| 2020/0227470 A1* | 7/2020 | Then | H01L 23/66 |

OTHER PUBLICATIONS

Gokhale V.J., et al., "GaN-Based Periodic High-Q RF Acoustic Resonator with Integrated HEMT", 2019 IEEE International Electron Devices Meeting (IEDM), IEEE, Dec. 7, 2019 (Dec. 7, 2019), XP033714440, 4 pages, DOI: 10.1109/1EDM19573.2019.8993528, [retrieved on Feb. 10, 2020] II, Design and Fabrication, p. 17.5.1, right-hand column—p. 17.5.2, left-hand column, figures 1, 2.

International Search Report and Written Opinion—PCT/US2021/027829—ISA/EPO—dated Oct. 13, 2021.

Wu L-S., et al., "Heterogeneous Integration of GaAs pHEMT and Si CMOS on the Same Chip", Chinese Physics B, Chinese Physics B, Bristol GB, vol. 25, No. 6, Jun. 2, 2016 (Jun. 2, 2016), pp. 67306-1-67306-6, XP020304639, ISSN: 1674-1056, DOI: 10.1088/1674-1056/25/6/067306 [retrieved on Jun. 2, 2016] 2. Fabrication, pp. 67306-1, right-hand column—pp. 67306-2, right-hand column, figure 1.

\* cited by examiner

HETEROGENEOUS INTEGRATED WIDEBAND HIGH ELECTRON MOBILITY TRANSISTOR POWER AMPLIFIER WITH A SINGLE-CRYSTAL ACOUSTIC RESONATOR/FILTER

BACKGROUND

Field

The present disclosure relates generally to wireless communications systems and, more specifically, to a heterogeneous integrated wideband high electron mobility (HEMT) power amplifier (PA) with a single-crystal acoustic resonator/filter.

Background

Design challenges for mobile radio frequency (RF) transceivers include performance considerations for meeting fifth generation (5G) and future sixth generation (6G) transmission frequency specifications. These 5G/6G performance specifications mandate a substantial transmission frequency increase over current standards for supporting future transmission frequency specifications. Transistors are generally selected to operate at substantially higher frequencies for supporting communications enhancements, such as millimeter wave. These transistors are commonly implemented using compound semiconductor transistors, such as heterojunction bipolar transistors (HBTs), high-electron-mobility transistors (HEMTs), pseudomorphic high-electron-mobility transistors (pHEMTs), and the like.

High-electron-mobility transistors are excellent candidates for meeting 5G/6G transmission frequency specifications. In particular, high-electron-mobility transistors using a wide bandgap channel (e.g., nitride semiconductors) may significantly boost RF power density while supporting the substantially higher transmission frequencies.

SUMMARY

A 3D integrated circuit (3D IC) chip is described. The 3D IC chip includes a die having a compound semiconductor high electron mobility transistor (HEMT) active device. The compound semiconductor HEMT active device is composed of compound semiconductor layers on a single crystal, compound semiconductor layer. The 3D IC chip also includes an acoustic device integrated in the single crystal, compound semiconductor layer. The 3D IC chip further includes a passive device integrated in back-end-of-line layers of the die on the single crystal, compound semiconductor layer.

A method of making a 3D integrated circuit (3D IC) chip is described. The method includes epitaxially growing a single crystal, compound semiconductor layer on a semiconductor substrate. The method also includes epitaxially growing compound semiconductor layers on the single crystal, compound semiconductor layer. The method further includes fabricating a compound semiconductor high electron mobility transistor (HEMT) active device from the compound semiconductor layers on the single crystal, compound semiconductor layer on the semiconductor substrate. The method also includes integrating an acoustic device in the single crystal, compound semiconductor layer. The method further includes fabricating an integrated passive device in back-end-of-line layers of the 3D IC chip on the single crystal, compound semiconductor layer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings in which like reference characters identify correspondingly throughout.

DETAILED DESCRIPTION

Figure 1:
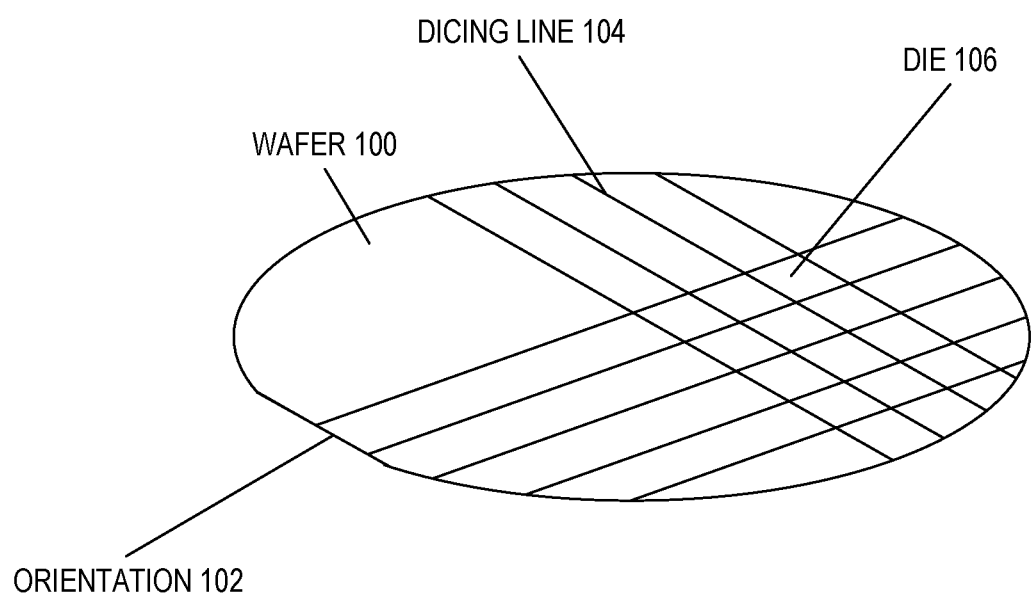
FIG. 1 illustrates a perspective view of a semiconductor wafer.

The detailed description set forth below, in connection with the appended drawings, is intended as a description of various configurations and is not intended to represent the only configurations in which the concepts described may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

5G/6G transmission frequency specifications mandate a substantial transmission frequency increase (e.g., ten gigabits per second (10 Gbps)) over current standards for supporting future performance specifications. Furthermore, various technology innovations are driving the demand for massive wireless communications speed. These technology innovations include, for example, autonomous driving, industry Internet-of-things (IOT), remote medical operations/resource sharing, and infotainment/gaming/education. Other technology innovations include interactive collaborations with artificial intelligence (AI) and virtual reality (VR)/artificial reality (AR)/mixed reality (MR)/extended reality (XR) devices. These technology innovations are driving the demand for air interfaces operating at a speed of ten gigabits per second (10 Gbps) with a latency of less than one millisecond (e.g., <1 ms latency).

In addition, media applications are also driving the demand for massive wireless communications speed. In particular, live high definition (HD) video (4K/8K) and high frequency voice over Internet protocol (HF VoIP) audio content transmission for mixed reality (MR) and extended reality (XR) specify both downlink and uplink speeds much higher than 10 Gbps. These massive data transmission rates may be realized with millimeter wave (mmWave) communications that can offer a wider bandwidth.

In order to meet this demand, advanced semiconductor technologies (e.g., sub-six (6) GHz radio frequency integrated circuit (RFIC), mmWave (e.g., Ka/28 GHz, Ku/39 GHz) and monolithic microware integrated circuit (MMIC) frontend) have been developed. In addition, advanced silicon complementary metal oxide semiconductor (CMOS) process technology nodes (e.g., 28 nm, 22 nm, 16 nm/14 nm, 10 nm, 7 nm, 5 nm) on bulk, semiconductor on insulator (SOI), and a fully-depleted SOI (FD-SOI) process platform are developed for cutting-edge modems, sensors, biometrics, and AI chips.

Unfortunately, a 3D integrated circuit (3D IC) technology solution is unavailable (or has not reached maturity) to deliver the power-performance-area-cost (PPAC) specification for next generation (NextGen) high-performance/low-power mobile user equipment (UE) devices. Realization of these NextGen UE devices is desired by leading industry players for driving forward NextGen consumer products.

Aspects of the present disclosure are directed to a monolithic 3D IC chip. The 3D IC chip includes a die having a compound semiconductor high electron mobility transistor (HEMT) active device. In aspects of the present disclosure, the compound semiconductor HEMT active device is composed of compound semiconductor layers grown on a single crystal, compound semiconductor layer. The 3D IC chip also includes an acoustic device integrated in the single crystal layer. The 3D IC chip further includes a passive device integrated in back-end-of-line layers of the die on the single crystal, compound semiconductor layer.

According to one aspect of the present disclosure, the 3D IC chip is composed of a heterogeneous wideband compound semiconductor FET power amplifier (PA) integrated with narrow band acoustic filters and broadband integrated passive device filters. In one configuration, the compound semiconductor HEMT active device is implemented as an aluminum gallium nitride (AlGaN)/gallium nitride (GaN) heterogeneous wideband HEMT power amplifier. In this configuration, the HEMT power amplifier is integrated with a single-crystalline aluminum nitride (AlN) bulk acoustic wave (X-BAW) acoustic resonators/filter to provide an acoustic device. The 3D IC chip also integrates a broadband integrated passive device (IPD) matched component/filter device in a back-end-of-line layer.

This HEMT power amplifier configuration meets a desired power amplifier specification (e.g., B41 (band 41) PA (power amplifier) module (2.5-2.69 GHz)). In particular, the single crystal AlN layer enables a high (e.g., X2: twice) electro-mechanical coupling coefficient ($kt^2$) to cover the approximately two-hundred megahertz (200 MHz) bandwidth of, for example, the B41 PA module specification. In addition, the devices are face-to-face (F2F)-bonded on a thin/thermal conductive alumina substrate for an integrated RF front end. This integration of the HEMT PA offers high efficiency, power density, a wideband, and efficient impedance matching.

Successful fabrication of modern semiconductor chip products, such as compound semiconductor bipolar transistors and field effect transistors involves interplay between the materials and the processes employed. The process flow for semiconductor fabrication of the integrated circuit structure may include front-end-of-line (FEOL) processes, middle-of-line (MOL) (also referred to as middle-end-of-line (MEOL)) processes, and back-end-of-line (BEOL) processes to form interconnects (e.g., M1, M2, M3, M4, etc.). The front-end-of-line processes may include the set of process steps that form the active devices, such as transistors, capacitors, and diodes.

The front-end-of-line processes include ion implantation, anneals, oxidation, chemical vapor deposition (CVD) or atomic layer deposition (ALD), etching, chemical mechanical polishing (CMP), and epitaxy. The middle-of-line processes may include the set of process steps that enable connection of the transistors to back-end-of-line interconnects. These steps include silicidation and contact formation, as well as stress introduction. The back-end-of-line processes may include the set of process steps that form the interconnects that tie the independent transistors and form circuits, as shown in FIGS. 1 and 2A-2B.

Figure 2A:
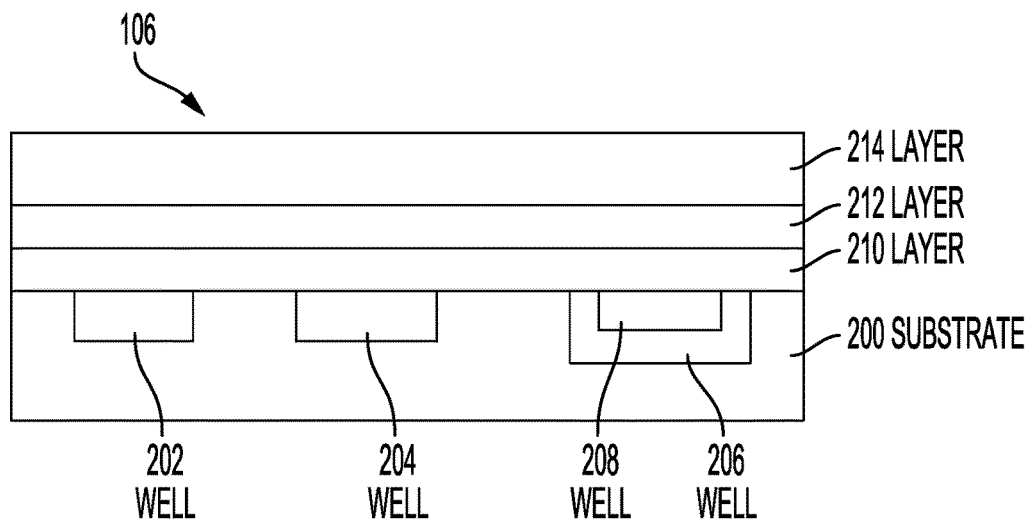
FIGS. 2A-2B illustrate cross-sectional views of a die.
Figure 2B:
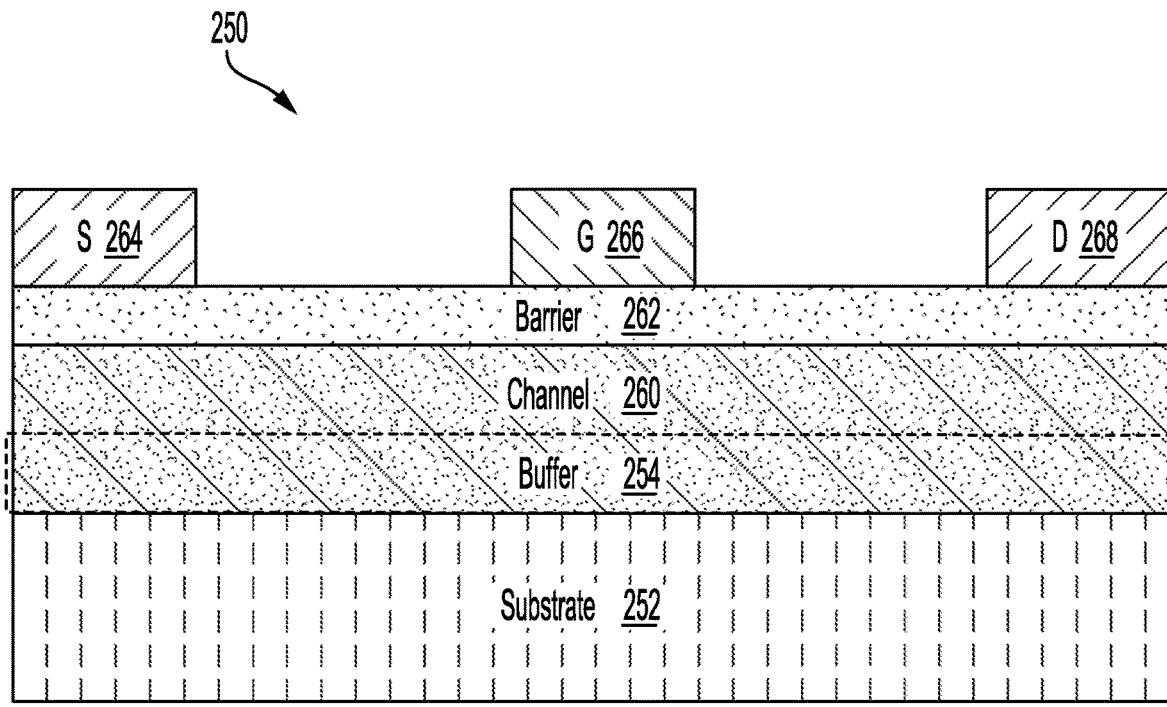

FIG. 1 illustrates a perspective view of a semiconductor wafer. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystalizes onto the seed crystal in the orientation of the crystal.

The wafer 100 may be composed of a compound semiconductor material, such as gallium arsenide (GaAs), indium phosphide (InP), or gallium nitride (GaN), a ternary material such as indium gallium arsenide (InGaAs), aluminum gallium arsenide (AlGaAs), or indium gallium stibium (In- GaSb), quaternary materials such as indium gallium arsenide phosphide (InGaAsP), or any material that can be a substrate material for other compound semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

After the wafer 100 is processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form the die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

After the wafer 100 is separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of packaging that provide access to the die 106. The die 106 may also be directly accessed through wire bonding, probes, or other connections without mounting the die 106 into a separate package.

FIG. 2A illustrates a cross-sectional view of a die 106. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200 according to a CMOS process.

The semiconductor substrate may also have a well 206 and a well 208. The well 208 may be completely within the well 206. The well 206 may also be used as an isolation well to isolate the well 208 from electric and/or magnetic fields within the die 106. Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may include a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may include many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other CMOS methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure. The substrate 200, the wells 202-208, and the layers (e.g., 210-214) may enable formation of a compound semiconductor transistor, such as bipolar transistors (BJTs), heterojunction bipolar transistors (HBTs), high-electron-mobility transistors (HEMTs), pseudomorphic high-electron-mobility transistors (PHEMTs), and the like.

Bipolar transistors, which are also referred to as bipolar junction transistors (BJTs), are a type of transistor that uses both hole and electron charge carriers. A heterojunction bipolar transistor (HBT) is a type of bipolar transistor that uses different semiconductor materials for emitters and base regions of the device, which create a heterojunction. A high-electron-mobility transistor (HEMT) is a type of field effect transistor (FET) that relies on a junction between different semiconductor materials with different bandgaps to form a heterojunction. A high-electron-mobility transistor may use a III-V compound semiconductor material, a II-VI compound semiconductor material, or other like compound semiconductor material. High-electron-mobility transistors may improve upon heterojunction transistors by supporting substantially higher transmission frequencies, which may meet 5G and future 6G performance specifications, as shown in FIG. 2B.

FIG. 2B illustrates a compound semiconductor field effect transistor (FET) 250 configuration of the die 106. Representatively, the compound semiconductor FET 250 includes a semi-insulating substrate 252 (e.g., silicon (Si), silicon carbide (SiC), or aluminum oxide ($Al_2O_3$)). A buffer layer 254 (optional) is on the semi-insulating substrate 252. The buffer layer 254, which may be composed of a compound semiconductor material (e.g., gallium arsenide (GaAs)), is grown on the semi-insulating substrate 252 to isolate defects from the semi-insulating substrate 252. The buffer layer 254 provides a smooth surface on which to grow the active layers of the compound semiconductor FET 250. The buffer layer 254, however, is optional, such that the active layers may be grown directly on the semi-insulating substrate 252.

The compound semiconductor FET 250 also includes a channel 260, which is generally grown after the buffer layer 254 and may be composed of gallium nitride (GaN), or other like compound semiconductor materials. Ideally, all electron conduction of the compound semiconductor FET 250 should take place in the channel 260. A barrier layer 262 (e.g., aluminum gallium nitride (AlGaN)) is grown on the channel 260. In this example, the barrier layer 262 support a source (S) 264, a gate (G) 266, and a drain (D) 268 of the compound semiconductor FET 250. The compound semiconductor FET 250 may be used in a high speed circuit, such as radio frequency (RF) chip designs including RF power amplifiers in mobile RF transceivers of an RF front end module, for example, as shown in FIG. 3.

Figure 3:
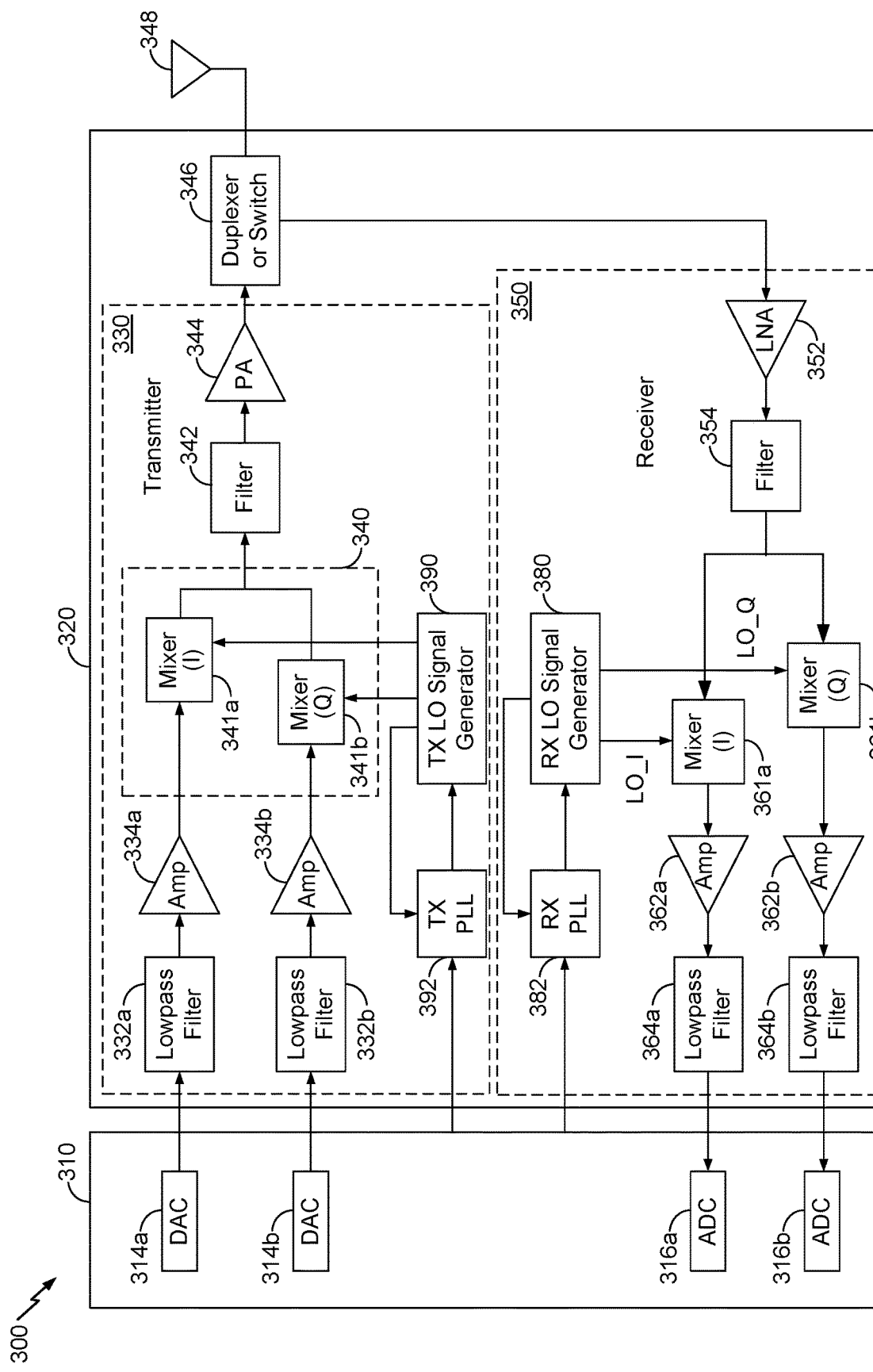
FIG. 3 shows a block diagram of an exemplary wireless device.

FIG. 3 shows a block diagram of an exemplary design of a wireless device 300. FIG. 3 shows an example of a transceiver 320, which may be a wireless transceiver (WTR). In general, the conditioning of the signals in a transmitter 330 and a receiver 350 may be performed by one or more stages of amplifier(s), filter(s), upconverters, downconverters, and the like. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, the wireless device 300 generally includes the transceiver 320 and a data processor 310. The data processor 310 may include a memory (not shown) to store data and program codes, and may generally include analog and digital processing elements. The transceiver 320 may include the transmitter 330 and receiver 350 that support bi-directional communication. In general, the wireless device 300 may include any number of transmitters and/or receivers for any number of communications systems and frequency bands. All or a portion of the transceiver 320 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and then from intermediate frequency to baseband in another stage for a receiver. In the direct-conversion architecture, a signal is frequency converted between radio frequency and baseband in one stage. The super-heterodyne and direct-conversion architectures may use different circuit blocks and/or have different requirements. In the example shown in FIG. 3, the transmitter 330 and the receiver 350 are implemented with the direct-conversion architecture.

In a transmit path, the data processor 310 processes data to be transmitted. The data processor 310 also provides in-phase (I) and quadrature (Q) analog output signals to the transmitter 330 in the transmit path. In an exemplary aspect, the data processor 310 includes digital-to-analog converters (DACs) 314a and 314b for converting digital signals generated by the data processor 310 into the in-phase (I) and quadrature (Q) analog output signals (e.g., I and Q output currents) for further processing.

Figure 4:
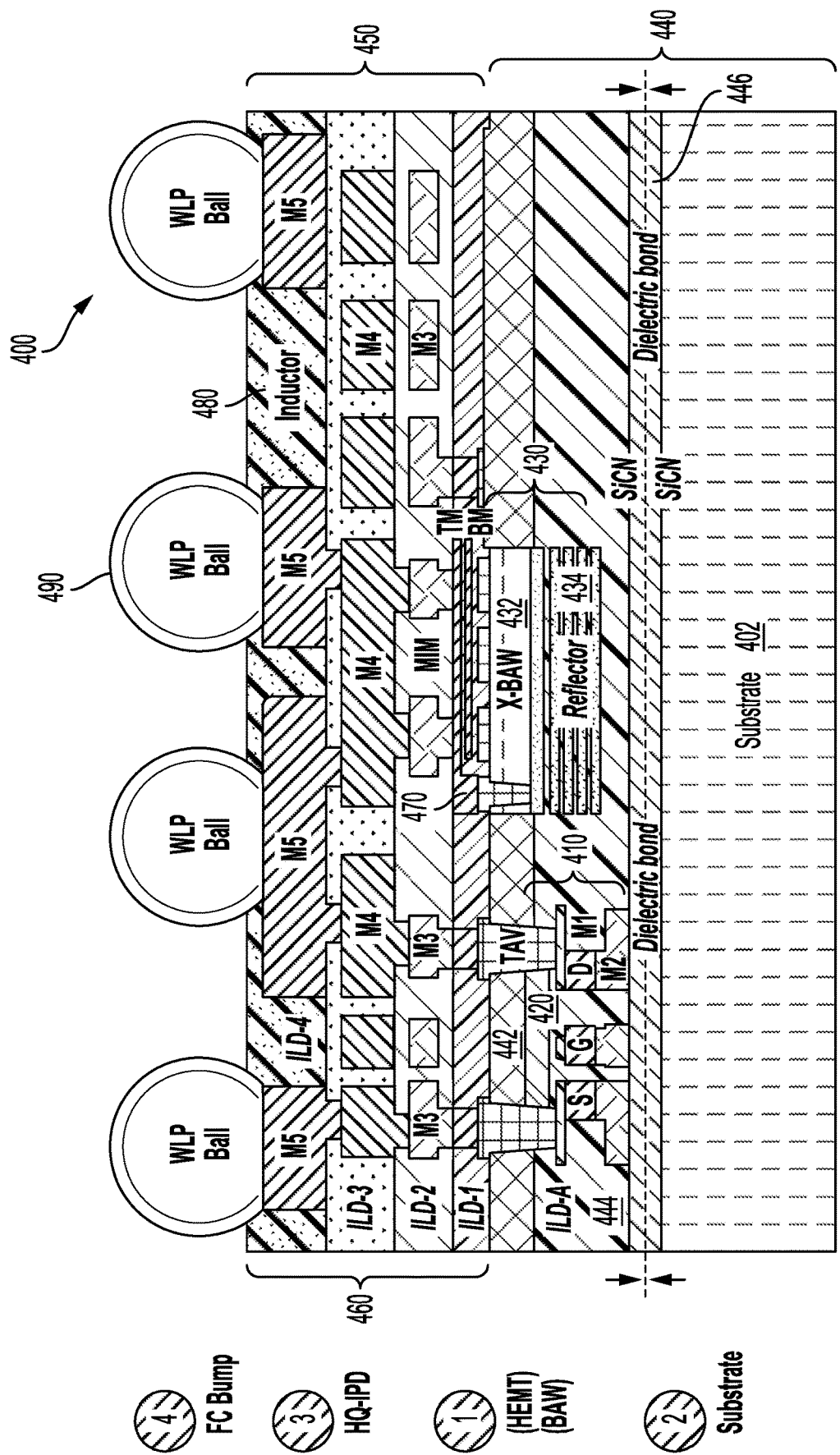
FIG. 4 illustrates a 3D integrated circuit (3D IC) chip including a compound semiconductor field effect transistor (FET) power amplifier (PA) integrated with narrow band acoustic filters and broadband integrated passive device filters, according to aspects of the present disclosure.

Within the transmitter 330, lowpass filters 332a and 332b filter the in-phase (I) and quadrature (Q) analog transmit signals, respectively, to remove undesired images caused by the prior digital-to-analog conversion. Amplifiers (Amp) 334a and 334b amplify the signals from lowpass filters 332a and 332b, respectively, and provide in-phase (I) and quadrature (Q) baseband signals. An upconverter 340 upconverts the in-phase (I) and quadrature (Q) baseband signals with in-phase (I) and quadrature (Q) transmit (TX) local oscillator (LO) signals from a TX LO signal generator 390 to provide an upconverted signal. A filter 342 filters the upconverted signal to remove undesired images caused by the frequency upconversion, as well as noise in a receive frequency band. A power amplifier (PA) 344 amplifies the signal from the filter 342 to obtain the desired output power level and provides a transmit radio frequency signal. The power amplifier 344 may be implemented using a high-electron-mobility transistor (HEMT), such as a one comprising wide bandgap nitride semiconductors, for example, as shown in FIG. 4. The transmit radio frequency signal is routed through a duplexer/switch 346 and transmitted via an antenna 348.

In a receive path, the antenna 348 receives communications signals and provides a received radio frequency (RF) signal, which is routed through the duplexer/switch 346 and provided to a low noise amplifier (LNA) 352. The duplexer/switch 346 is designed to operate with a specific receive (RX) to transmit (TX) (RX-to-TX) duplexer frequency separation, such that RX signals are isolated from TX signals. The received RF signal is amplified by the LNA 352 and filtered by a filter 354 to obtain a desired RF input signal. Downconversion mixers 361a and 361b mix the output of the filter 354 with in-phase (I) and quadrature (Q) receive (RX) LO signals (i.e., LO_I and LO_Q) from an RX LO signal generator 380 to generate in-phase (I) and quadrature (Q) baseband signals. The in-phase (I) and quadrature (Q) baseband signals are amplified by amplifiers 362a and 362b and further filtered by lowpass filters 364a and 364b to obtain in-phase (I) and quadrature (Q) analog input signals, which are provided to the data processor 310. In the exemplary configuration shown, the data processor 310 includes analog-to-digital converters (ADCs) 316a and 316b for converting the analog input signals into digital signals for further processing by the data processor 310.

In FIG. 3, the transmit local oscillator (TX LO) signal generator 390 generates the in-phase (I) and quadrature (Q) TX LO signals used for frequency upconversion, while a receive local oscillator (RX LO) signal generator 380 generates the in-phase (I) and quadrature (Q) RX LO signals used for frequency downconversion. Each LO signal is a periodic signal with a particular fundamental frequency. A phase locked loop (PLL) 392 receives timing information from the data processor 310 and generates a control signal used to adjust the frequency and/or phase of the TX LO signals from the TX LO signal generator 390. Similarly, a PLL 382 receives timing information from the data processor 310 and generates a control signal used to adjust the frequency and/or phase of the RX LO signals from the RX LO signal generator 380.

A power amplifier 344 may be implemented using a high-electron-mobility transistor (HEMT), such as the compound semiconductor FET 250, as shown in FIG. 2B. A high-electron-mobility transistor is a type of field effect transistor (FET) that relies on a junction between different semiconductor materials with different bandgaps to form a heterojunction. High-electron-mobility transistors based on wide bandgap semiconductors (e.g., gallium nitride) provide significantly increased RF power density, high efficiency and wideband impedance matching, while supporting operation at the high frequencies specified of 5G communication links.

A solution to harness the power-performance-area-cost (PPAC) benefits of mmWave/MMIC for deployment in infrastructure/base-station, wireless fixed access point (WFA), customer premise equipment (CPE), and mobile user equipment (UE) devices is desired. While GaN on CMOS has been successfully demonstrated for an 8-inch wafer process, the larger stress challenges deterred the technology from advancing beyond 8-inches. In addition, aluminum nitride (AlN) resonators/filters demonstrated for post-CMOS integration with physical vapor deposition (PVD) based polycrystalline AlN film, are compromised by a limited electro-mechanical coupling coefficient ($K_t^2$) and quality (Q)-factor for adequate figure of merit (FOM) for low insertion loss and wideband filters.

Aspects of the present disclosure are directed to a monolithic 3D integrated circuit (3D IC) chip. The 3D IC chip includes a die having a compound semiconductor high electron mobility transistor (HEMT) active device. In aspects of the present disclosure, the compound semiconductor HEMT active device is composed of compound semiconductor epitaxial layers grown on a silicon substrate with a [111] orientation. The 3D IC chip also includes an acoustic device integrated in the single crystal layer. The 3D IC chip further includes a passive device integrated in back-end-of-line layers of the die on the single crystal, compound semiconductor layer.

According to one aspect of the present disclosure, the 3D IC chip is composed of a heterogeneous wideband compound semiconductor FET power amplifier (PA) integrated with narrow band acoustic filters and broadband integrated passive device filters. In one configuration, the compound semiconductor HEMT active device is implemented as using an aluminum gallium nitride (AlGaN)/gallium nitride (GaN) HEMT power amplifier. In this configuration, the HEMT power amplifier is integrated with a single-crystalline AlN (aluminum nitride) bulk acoustic wave (X-BAW) acoustic resonator/filter to provide an acoustic device. The 3D IC chip also integrates a broadband integrated passive device (IPD) matched component/filter device in a back-end-of-line layer, for example, as shown in FIG. 4.

FIG. 4 illustrates a 3D integrated circuit (3D IC) chip including a compound semiconductor field effect transistor (FET) power amplifier (PA) integrated with narrow band acoustic filters and broadband integrated passive device filters, according to aspects of the present disclosure. Representatively, a 3D IC chip 400 includes a die 440, including a compound semiconductor high electron mobility transistor (HEMT) active device 410 (e.g., a HEMT power amplifier). The compound semiconductor HEMT active device 410 may be composed of compound semiconductor layers 420 (e.g., GaN/AlGaN) on a single crystal, compound semiconductor layer 442 (e.g., a single-crystal layer of aluminum nitride (AlN)). In one aspect of the present disclosure, use of a single-crystal layer of AlN provides thermal spreading for both the compound semiconductor HEMT active device 410 and an acoustic device 430.

In this aspect of the present disclosure, the die 440 includes the acoustic device 430 integrated in the single crystal, compound semiconductor layer 442. In one configuration, the acoustic device 430 is arranged side-by-side with the compound semiconductor HEMT active device 410. In this example, the acoustic device 430 is composed of a single crystal bulk acoustic wave (X-BAW) filter 432 and a reflector 434. In one configuration, the die 440 includes an interlayer dielectric layer 444 on the single crystal, compound semiconductor layer 442 and on the compound semiconductor HEMT active device 410. In this configuration, the reflector 434, coupled to the X-BAW filter 432, is in the interlayer dielectric layer 444.

According to aspects of the present disclosure, the compound semiconductor HEMT active device 410 is initially formed using a complementary metal oxide semiconductor (CMOS) substrate (e.g., a complementary metal oxide semiconductor (CMOS) die or a radio frequency (RF) die) and subsequently transferred and bonded to a substrate 402 (e.g., a thermally conductive substrate) using a dielectric bond layer 446. In this configuration, the substrate 402 is coupled to the interlayer dielectric layer 444 distal from the single crystal, compound semiconductor layer 442. In addition, the die 440 includes the dielectric bond layer 446 (e.g., silicon carbon nitride (SiCN)) between the substrate 402 and the interlayer dielectric layer 444. The substrate 402 may be a thermally conductive/electrically insulative substrate (e.g., alumina ($Al_2O_3$)).

The 3D IC chip 400 also includes an integrated passive device (IPD) 460 in back-end-of-line (BEOL) layers 450 (e.g., M3, M4, M5) of the die 440, on the single crystal, compound semiconductor layer 442. The IPD 460 may be formed from a capacitor 470 (e.g., a metal-insulator-metal (MIM)) and an inductor 480 composed of redistribution layers (RDLs) of the BEOL layers 450 (e.g., M4 and M5). For example, an interconnection of the capacitor 470 and the inductor 480 may provide an inductive-capacitor (LC) filter as the IPD 460. In addition, wafer level process (WLP) balls 490 are dropped on the M5 BEOL layer of the BEOL layers 450 to complete the 3D IC chip 400.

Figure 5A:
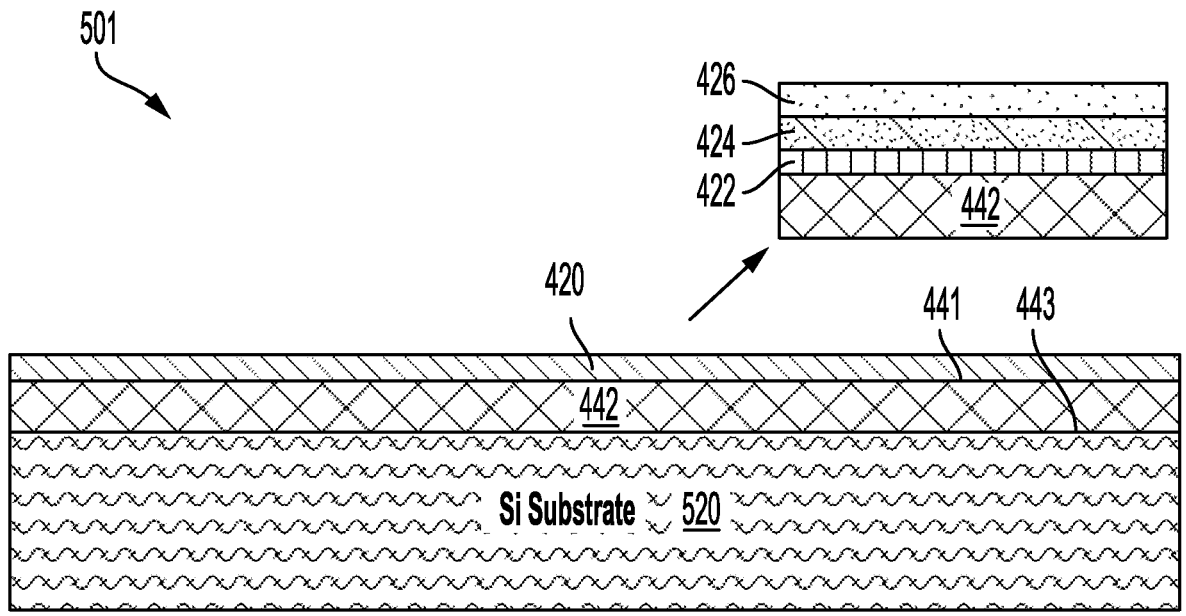
FIGS. 5A-5M illustrate a process flow for fabricating the 3D integrated circuit (3D IC) chip of FIG. 4 according to aspects of the present disclosure.

FIGS. 5A-5M illustrate a process flow for fabricating the 3D IC chip 400 of FIG. 4 according to aspects of the present disclosure. FIG. 5A illustrates a portion of the 3D IC chip 400 after step 501 of a fabrication process, according to aspects of the present disclosure. FIG. 5A shows a semiconductor substrate 520 (e.g., bulk silicon (Si)) supporting a single crystal, compound semiconductor layer 442 and compound semiconductor layers 420. In one aspect of the present disclosure, the single crystal, compound semiconductor layer 442 is formed by epitaxially growing a single crystal (X) aluminum nitride (X-AlN) layer on the semiconductor substrate 520. Subsequently, the compound semiconductor layers 420 are grown on the single crystal, compound semiconductor layer 442.

In one configuration, a first surface 441 (e.g., front side surface) of the single crystal, compound semiconductor layer 442 supports a buffer layer 422 (e.g., AlGaN), a channel layer 424 (e.g., GaN), and a barrier layer 426 (e.g., AlGaN), which are epitaxially grown, and which may form the compound semiconductor HEMT active device 410 as an HEMT power amplifier. The buffer layer 422 provides a surface on which to grow the active layers of the compound semiconductor HEMT active device 410. The buffer layer 422, however, may be optional when the active layers may be grown directly on the first surface of the single crystal, compound semiconductor layer 442 opposite a second surface 443 of the single crystal, compound semiconductor layer 442 directly on the semiconductor substrate 520.

The compound semiconductor HEMT active device 410 includes the channel layer 424, which is generally grown after the buffer layer 422 and may be composed of gallium nitride (GaN), or other like compound semiconductor materials. Ideally, all electron conduction of the compound semiconductor HEMT active device 410 should take place in the channel layer 424. A barrier layer 426 (e.g., aluminum gallium nitride (AlGaN)) is grown on the channel layer 424. In addition, a cap layer (not shown) may be grown on the barrier layer 426. Additional details for forming the cap layer (not shown), the barrier layer 426, the channel layer 424, and the buffer layer 422 are omitted to avoid obscuring innovative details of the present disclosure.

Figure 5B:
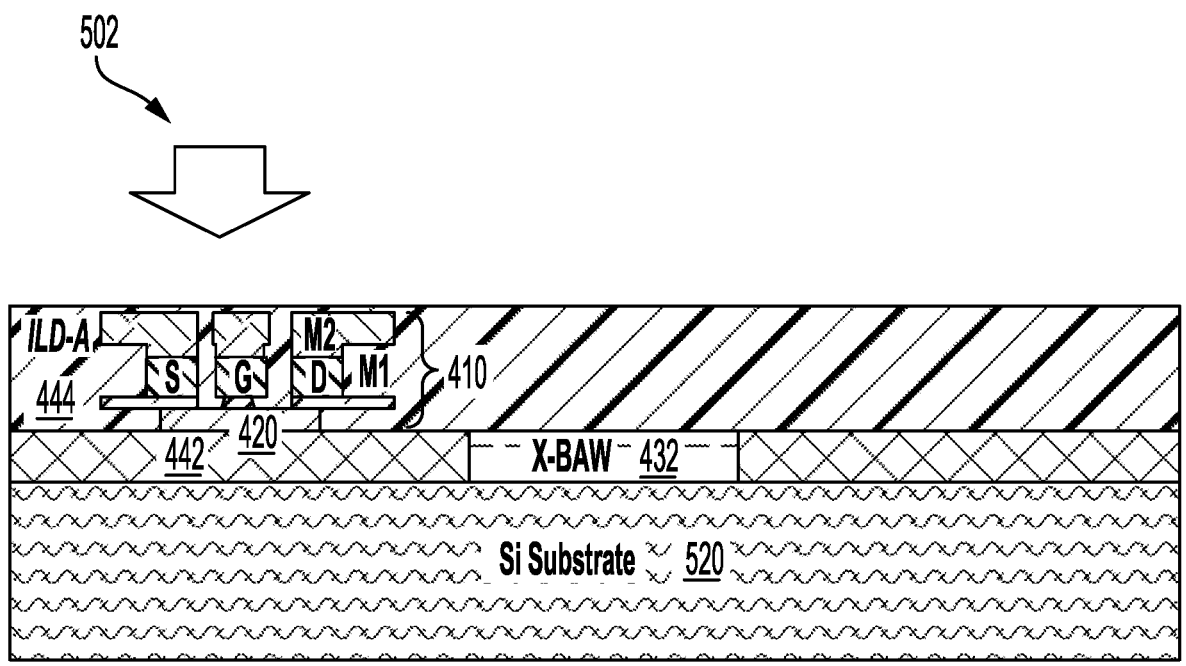

FIG. 5B illustrates a portion of the 3D IC chip 400 after step 502 of the process flow, according to aspects of the present disclosure. In step 502 of the process flow, fabrication of the compound semiconductor HEMT active device 410 is completed by forming BEOL connections (e.g., M1 and M2) to a source (S), a gate (G) and a drain (D). In this example, the compound semiconductor HEMT active device 410 is configured as an HEMT power amplifier, which is encapsulated in an interlayer dielectric layer 444. Once formed, a single crystal bulk acoustic wave (X-BAW) filter 432 is formed in the single crystal, compound semiconductor layer 442, as a portion of the acoustic device 430.

Figure 5C:
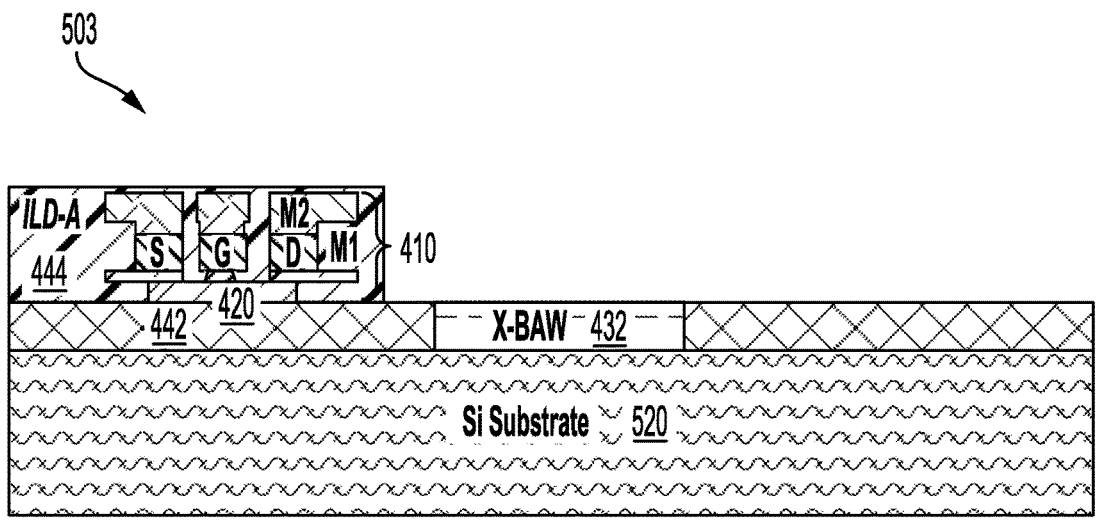

FIG. 5C illustrates a portion of the 3D IC chip 400 after step 503 of the process flow to form the acoustic device 430, according to aspects of the present disclosure. To form the acoustic device 430, the interlayer dielectric layer 444 is etched to expose a surface of the single crystal, compound semiconductor layer 442 including the X-BAW filter 432.

Figure 5D:
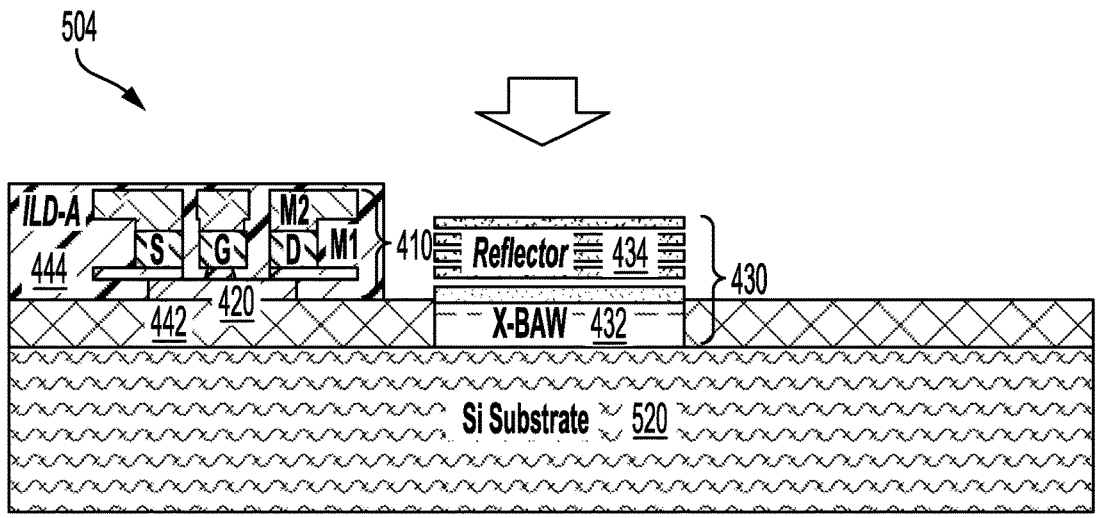

FIG. 5D illustrates a portion of the 3D IC chip 400 after step 504 of the process flow to form a reflector 434 of the acoustic device 430, according to aspects of the present disclosure. In this example, the reflector 434 is formed on the X-BAW filter 432. In addition, the compound semiconductor HEMT active device 410 and the acoustic device are planarized using, for example, a chemical mechanical polish (CMP) process.

Figure 5E:
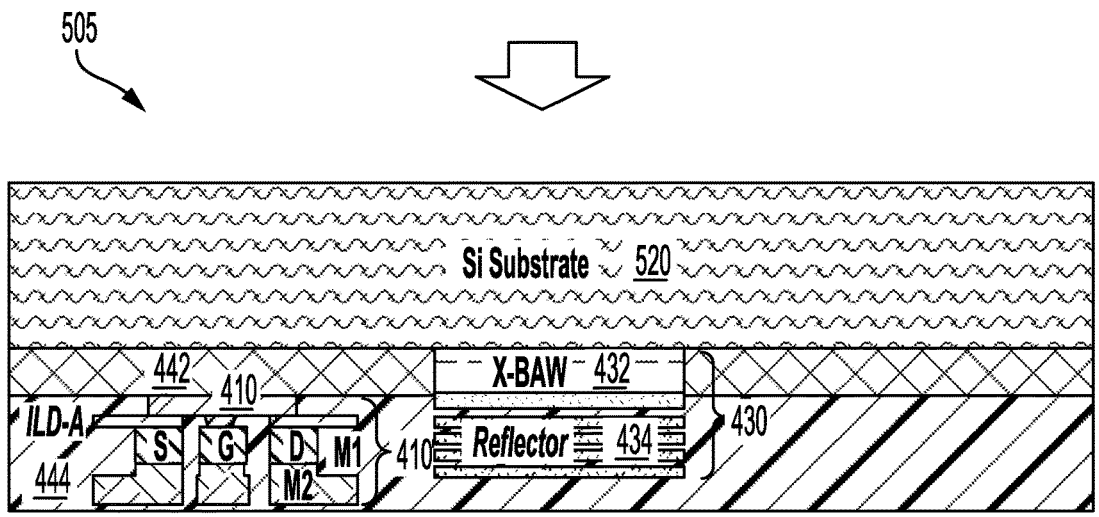

FIG. 5E illustrates a portion of the 3D IC chip 400 after step 505 of the process flow to prepare for removal of the semiconductor substrate 520, according to aspects of the present disclosure. Removal of the semiconductor substrate 520 is part of a layer transfer process to relocate the interlayer dielectric layer 444, including the compound semiconductor HEMT active device 410 and the acoustic device 430 to the substrate 402, as shown in FIG. 5F.

Figure 5F:
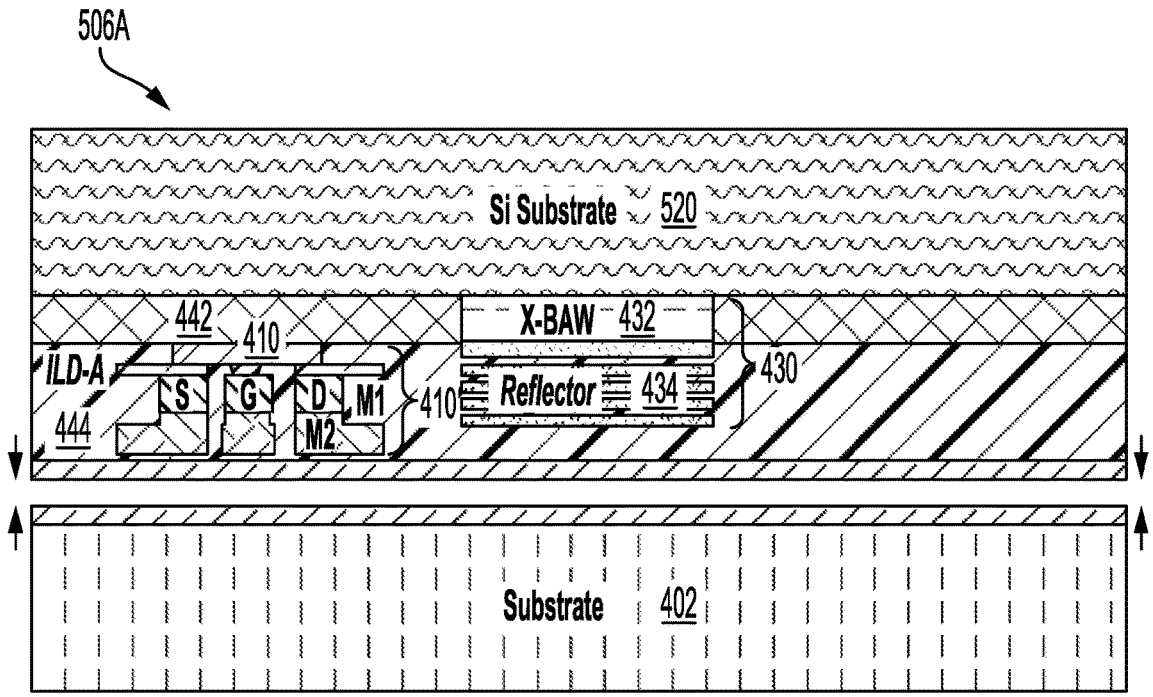

FIG. 5F illustrates a portion of the 3D IC chip 400 after step 506A of the process flow to perform layer transfer, according to aspects of the present disclosure. In this example, the interlayer dielectric layer 444, including the compound semiconductor HEMT active device 410 and the acoustic device 430, is bonded to the substrate 402. The bonding is enabled by growing the dielectric bond layer 446 on both the substrate 402 and the interlayer dielectric layer 444, including the compound semiconductor HEMT active device 410 and the acoustic device 430. In one aspect of the present disclosure, a cold bond process (e.g., at 100° C.-150° C.) bonds the dielectric bond layer 446 on the substrate 402 to the dielectric bond layer on the interlayer dielectric layer 444. In this example, a face-to-face (F2F) dielectric bonding is performed to bond the interlayer dielectric layer 444 to the substrate 402. In this configuration, the substrate 402 is a thermally conductive/electrically insulative substrate (e.g., alumina ($Al_2O_3$)). In addition, use a silicon carbon nitride (SiCN) layer as a dielectric bond layer provides better thermal conductivity relative to traditional silicon oxide (SiOx).

Figure 5G:
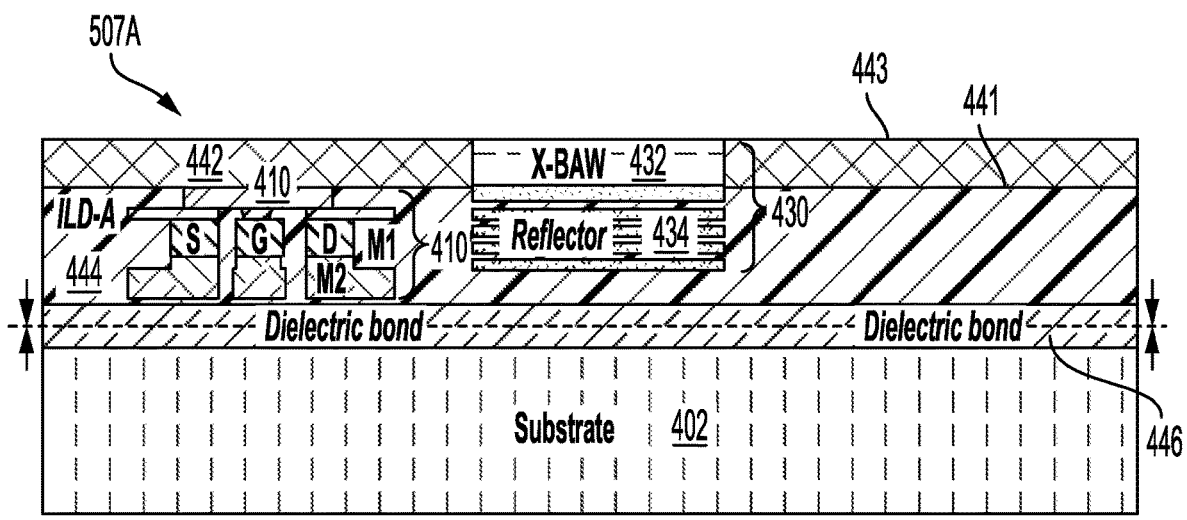

FIG. 5G illustrates a portion of the 3D IC chip 400 after step 507A of the process flow to remove the semiconductor substrate 520, according to aspects of the present disclosure. Removal of the semiconductor substrate 520 may be performed by a grinding process on the semiconductor substrate 520. Alternatively, an etch process is performed on the semiconductor substrate 520 until a second surface 443 (e.g., a backside surface) of the single crystal, compound semiconductor layer 442 is exposed. In this example, removal of the semiconductor substrate 520 exposes the second surface 443 (e.g., a backside surface) of the single crystal, compound semiconductor layer 442 on which the BEOL layers 450 are formed, as shown in FIGS. 5J and 5K.

Figure 5H:
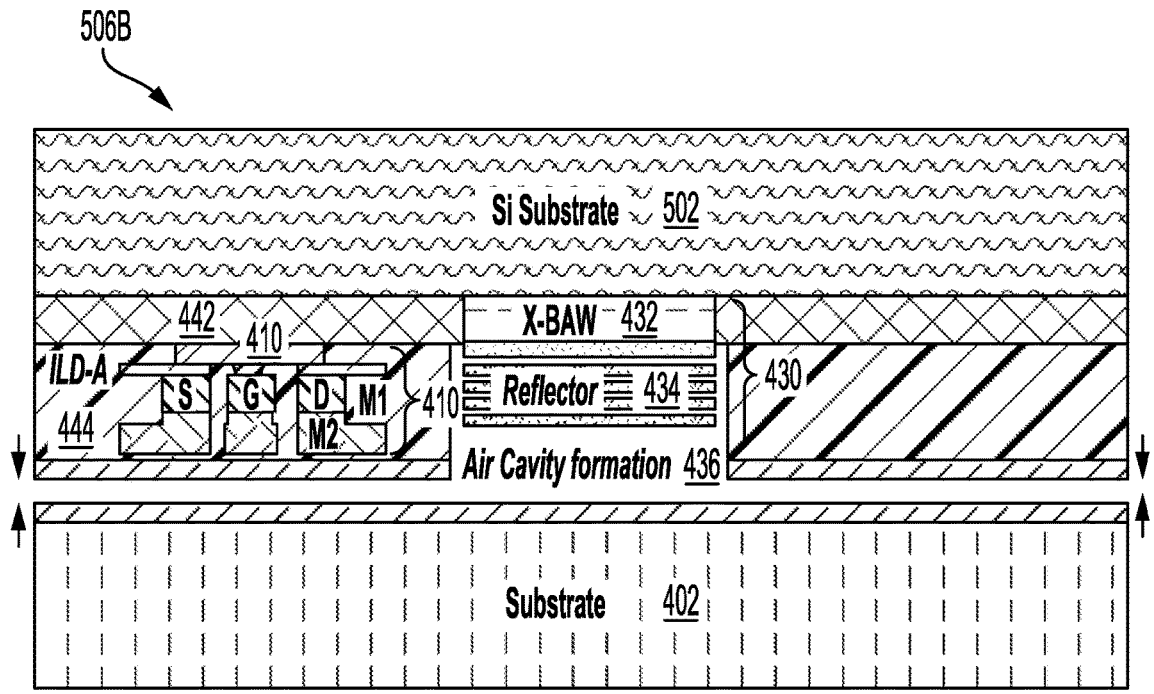
Figure 5I:
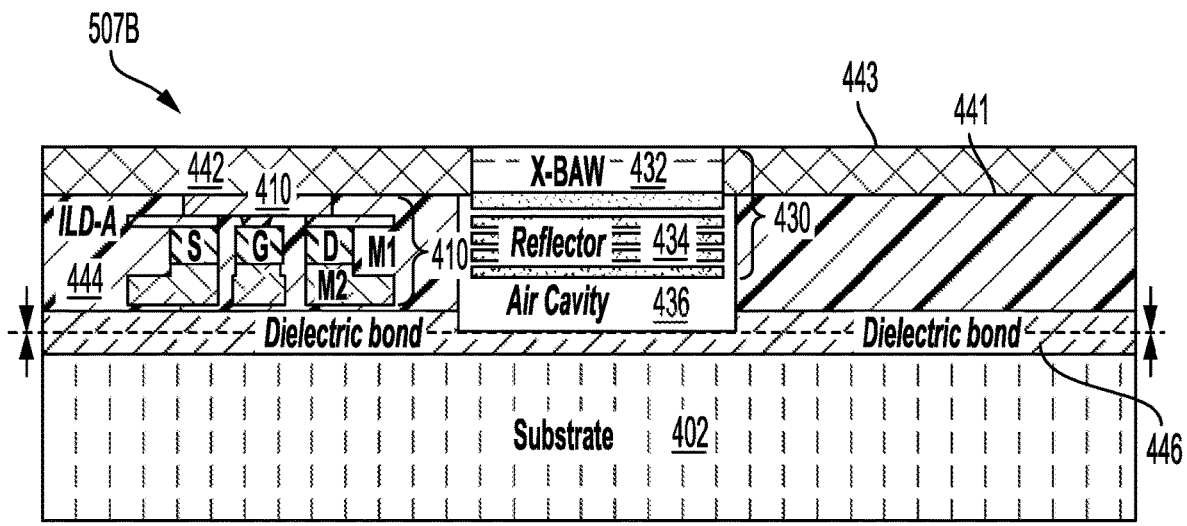

FIGS. 5H and 5I illustrate alternative steps 506B and 507B, in which the acoustic device 430 is formed with an air cavity 436. Otherwise, the process shown in FIGS. 5H and 5J is the same as the process flow shown in FIGS. 5F and 5G.

Figure 5J:
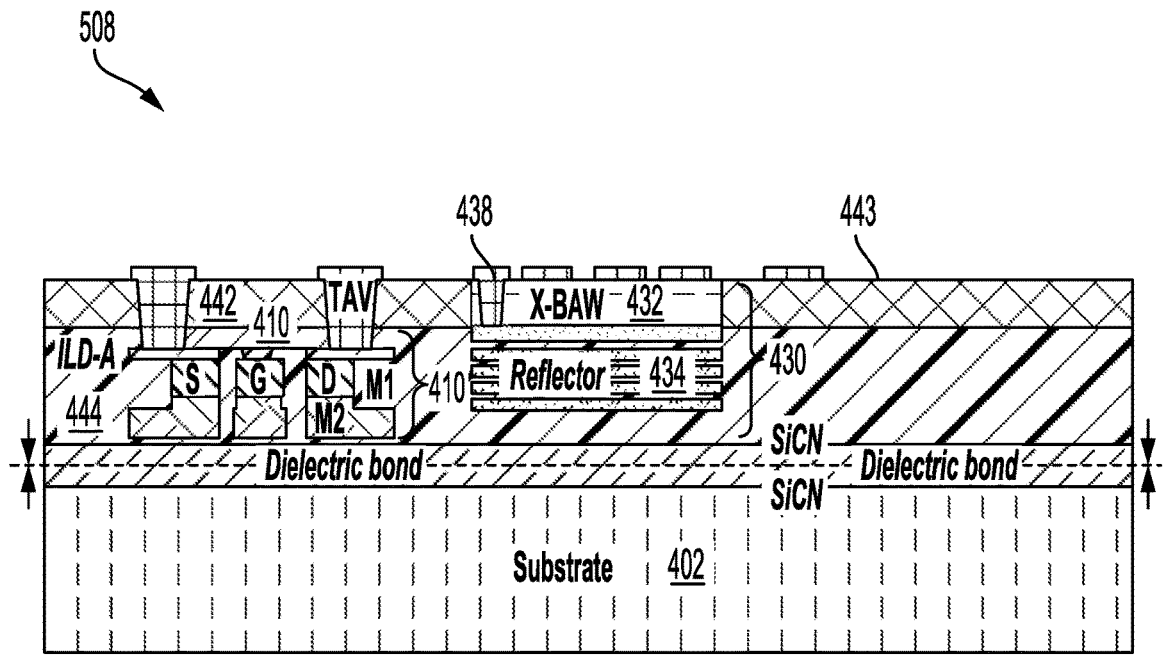

FIG. 5J illustrates a portion of the 3D IC chip 400 after step 508 of the process flow to form connections to the compound semiconductor HEMT active device 410 and the acoustic device 430, according to aspects of the present disclosure. In this example, an electrode 438 of the acoustic device 430 is formed on the X-BAW filter 432 and the second surface 443 (e.g., exposed backside surface) of the single crystal, compound semiconductor layer 442. In addition, through vias (e.g., through aluminum nitride (AlN) via (TAV)) are formed to land on source/drain ohmic contacts of the source/drain regions of the compound semiconductor HEMT active device 410.

Figure 5K:
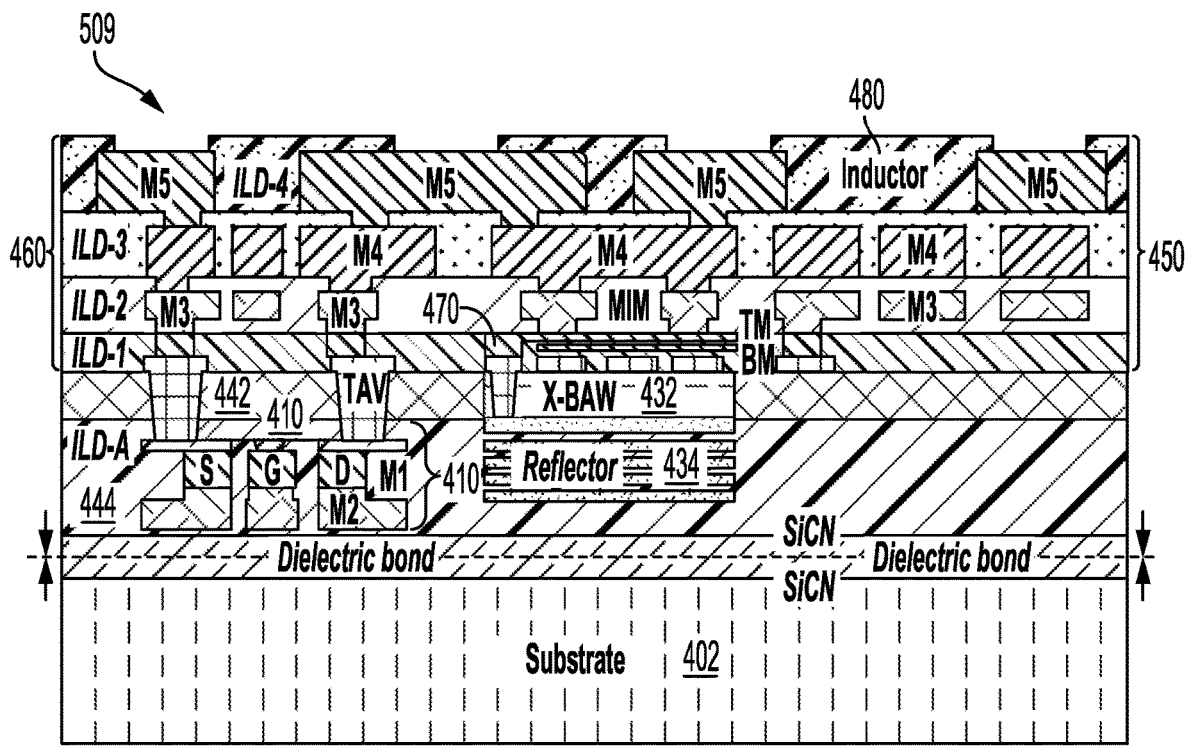

FIG. 5K illustrates a portion of the 3D IC chip 400 after step 509 of the process flow to form the IPD 460 in the BEOL layers 450, according to aspects of the present disclosure. In this example, the IPD 460 is formed in back-end-of-line (BEOL) layers 450 (e.g., M3, M4, M5) of the die 440, on the single crystal, compound semiconductor layer 442. Formation of the IPD 460 includes formation of a capacitor 470 (e.g., a metal-insulator-metal (MIM)) and an inductor 480. The capacitor 470 may include a bottom metal (BM), a dielectric, and a top metal (TM). In addition, the inductor 480 is composed of redistribution layers (RDLs) of the BEOL layers 450 (e.g., M4 and M5). Once formed, an interconnection of the capacitor 470 and the inductor 480 is deposited to provide an inductive-capacitor (LC) filter as the IPD 460.

Figure 5L:
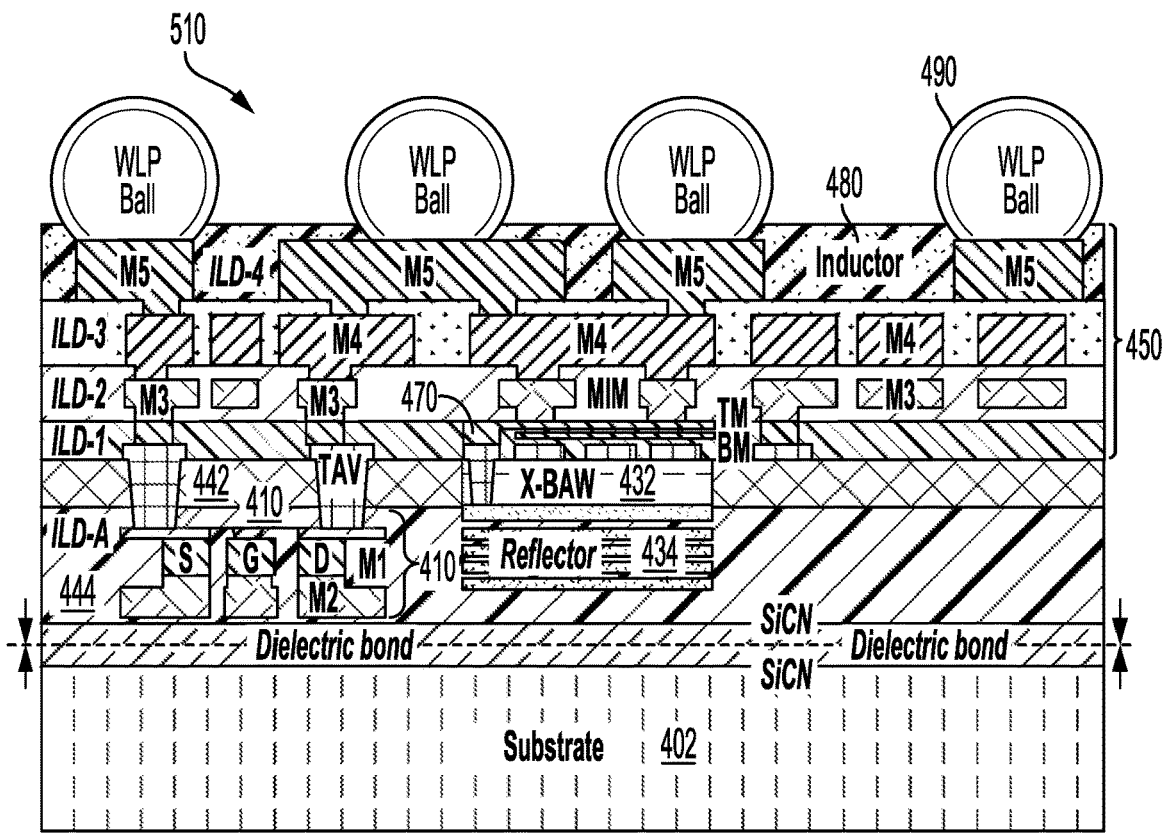

FIG. 5L illustrates the 3D IC chip 400 after step 510 of the process flow to form interconnections for the 3D IC chip 400, according to aspects of the present disclosure. In this example, wafer level process (WLP) balls 490 are dropped on the M5 BEOL layer of the BEOL layers 450 to complete formation of the 3D IC chip 400.

Figure 5M:
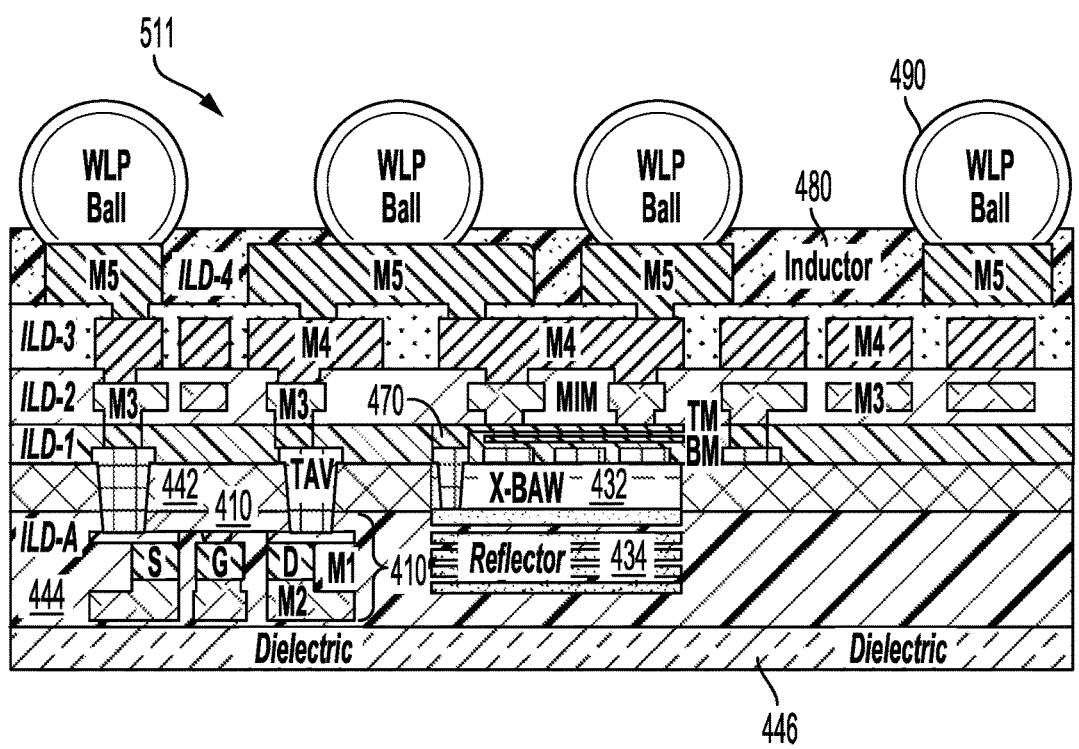

FIG. 5M illustrates a portion of the 3D IC chip 400 after step 511 of the process flow to remove the substrate 402, according to aspects of the present disclosure. In this example, the substrate 402 is de-bonded from the dielectric bond layer 446. This is an optional step that may be performed to reduce a height of the 3D IC chip 400.

Figure 6:
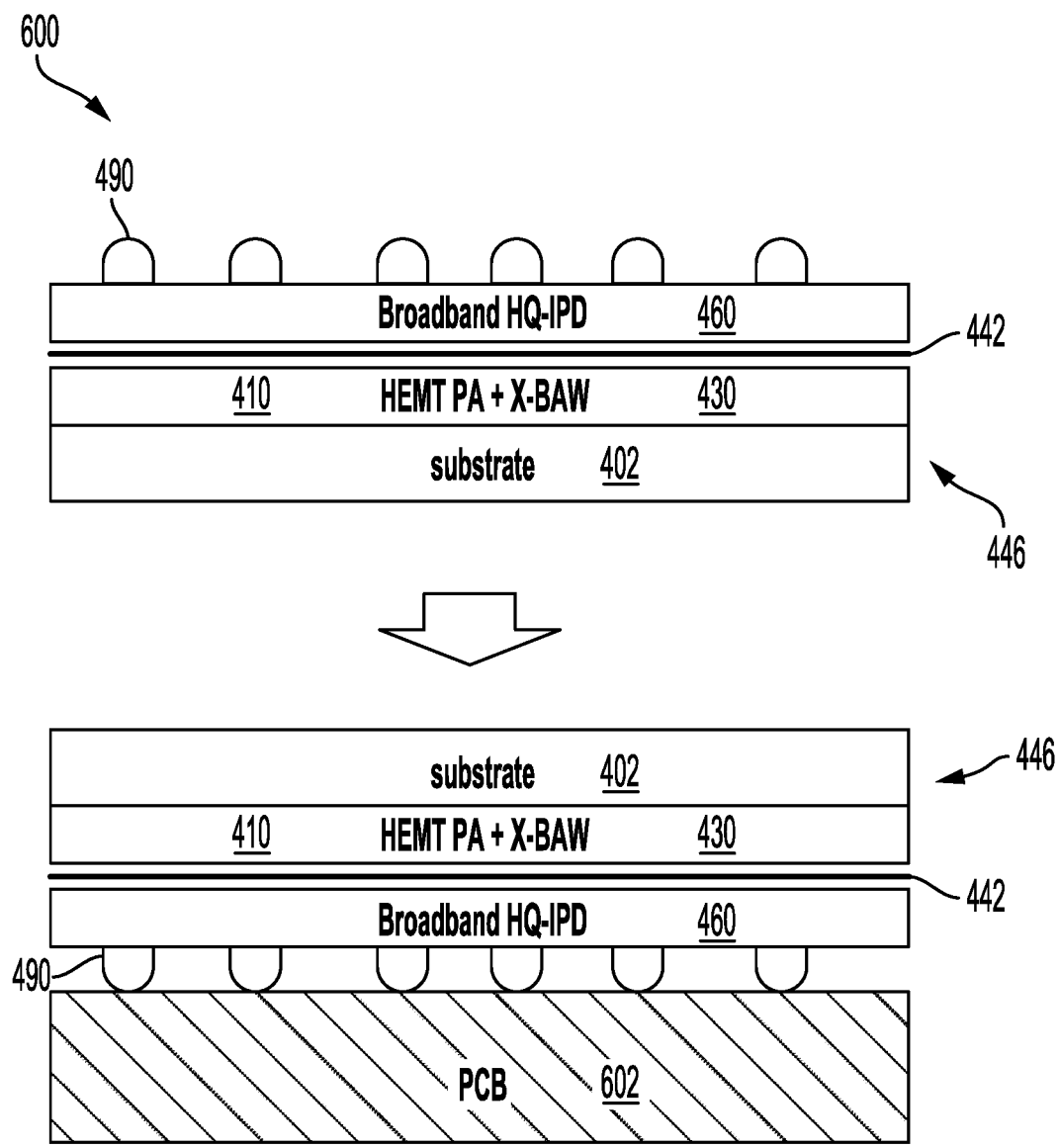
FIG. 6 illustrates the 3D integrated circuit (3D IC) chip of FIG. 4 supported by a printed circuit board, according to aspects of the present disclosure.

FIG. 6 illustrates the 3D IC chip 400 of FIG. 4 supported by a printed circuit board 600, according to aspects of the present disclosure. The 3D IC chip 400 is initially flipped. Once flipped, the WLP balls 490 are connected to a printed circuit board (PCB) 602. Connection of the WLP balls 490 to the PCB 602 may be performed using a solder reflow process. Although shown as WLP balls 490, the connection to the PCB 602 may be with copper bumps for a flip-chip (FC) bond to the PCB 602.

Figure 7:
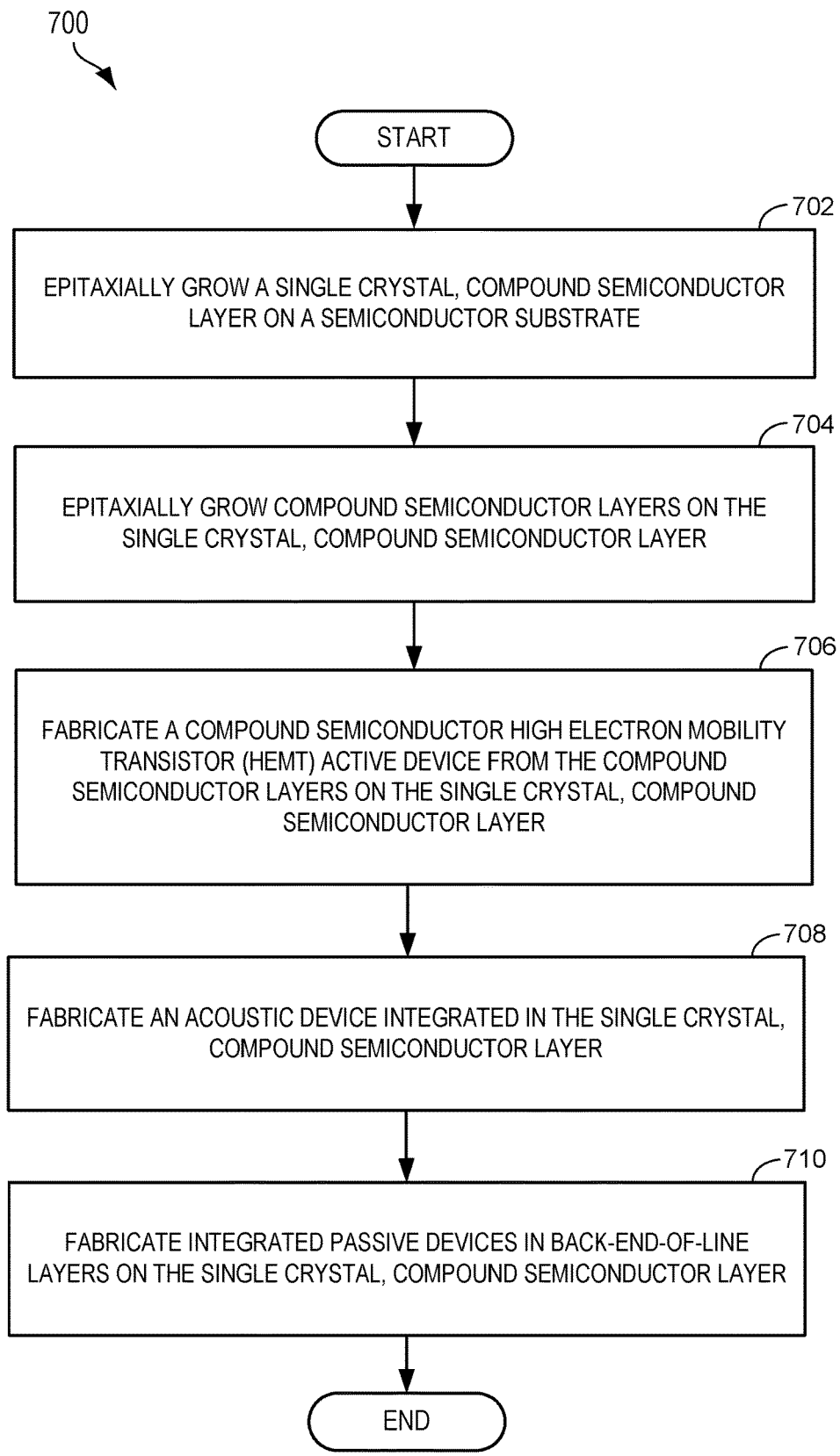
FIG. 7 is a flow diagram illustrating a method of making a 3D integrated circuit (3D IC) chip, in accordance with aspects of the present disclosure.

FIG. 7 is a flow diagram illustrating a method 700 of making a 3D integrated circuit (3D IC) chip, in accordance with aspects of the present disclosure. The blocks in the method 700 can be performed in or out of the order shown, and in some aspects, can be performed at least in part in parallel.

The method 700 begins at block 702, where a single crystal, compound semiconductor layer is epitaxially grown on a semiconductor substrate. For example, as shown in FIG. 5A, the single crystal, compound semiconductor layer 442 is formed by epitaxially growing a single crystal (X) aluminum nitride (X-AlN) layer (e.g., an X-AlN layer) on the semiconductor substrate 520 (e.g., a silicon wafer with a [111] orientation). At block 704, compound semiconductor layers are epitaxially grown on the single crystal, compound semiconductor layer. For example, as shown in FIG. 5A, a buffer layer 422 (e.g., AlGaN), a channel layer 424 (e.g., GaN), and a barrier layer 426 (e.g., AlGaN) are epitaxially grown on the single crystal, compound semiconductor layer 442.

Referring again to FIG. 7, at block 706, a compound semiconductor high electron mobility transistor (HEMT) active device is fabricated from the compound semiconductor layers on the single crystal, compound semiconductor layer. For example, as shown in FIG. 5A, the single crystal, compound semiconductor layer 442 supports a buffer layer 422 (e.g., AlGaN), a channel layer 424 (e.g., GaN), and a barrier layer 426 (e.g., AlGaN) to enable fabrication of the compound semiconductor HEMT active device 410. In the configuration shown in FIG. 5A, the compound semiconductor HEMT active device 410 is fabricated as a GaN HEMT for providing wideband power amplification to support 5G and future 6G communications.

Referring again to FIG. 7, at block 708, an acoustic device is fabricated and integrated in the single crystal, compound semiconductor layer. For example, as shown in FIGS. 5C-5E, a single crystal bulk acoustic wave (X-BAW) filter 432 is formed in the single crystal, compound semiconductor layer 442, as a portion of the acoustic device 430. As shown in FIG. 5D, the reflector 434 is formed on the X-BAW filter 432. In addition, the compound semiconductor HEMT active device 410 and the acoustic device are planarized using, for example, a chemical mechanical polish (CMP) process to complete formation of the acoustic device 430 in a side-by-side arrangement with the compound semiconductor HEMT active device 410, as shown in FIG. 5E. The method 700 may also include formation of through vias (e.g., a through AlN via (TAV)) to land on source/drain ohmic contacts of the source/drain regions of the compound semiconductor HEMT active device 410.

At block 710, integrated passive devices are fabricated in back-end-of-line (BEOL) layers of the 3D IC chip on the single crystal, compound semiconductor layer. For example, as shown in FIGS. 5J and 5K, the IPD 460 is formed in the BEOL layers 450 on the second surface 443 (e.g., the backside surface) of the single crystal, compound semiconductor layer 442. Formation of the IPD 460 includes formation of a capacitor 470 (e.g., a metal-insulator-metal (MIM)) and an inductor 480 composed of redistribution layers (RDLs) of the BEOL layers 450 (e.g., M4 and M5).

The method 700 may form the IPD 460 by depositing a first electrode and a second electrode separated by a dielectric layer to form a metal insulator metal (MIM) capacitor in a first back-end-of-line (BEOL) interlayer dielectric (ILD) layer on a backside surface of the single crystal, compound semiconductor layer. The method 700 may also include depositing a redistribution layer on the BEOL ILD layer to form an inductor. The method 700 may further include interconnecting the MIM capacitor and the inductor to form the integrated passive device. For example, as shown in FIG. 4, the IPD 460 may be formed from an interconnection of the capacitor 470 and the inductor 480 to provide an inductive-capacitor (LC) filter as the IPD 460 to enable a broadband high quality (Q)-ratio IPD filter.

According to one aspect of the present disclosure, a 3D IC chip includes a compound semiconductor (e.g., GaN) HEMT device arranged side-by-side with an X-BAW acoustic filter device, including a high-Q IPD formed in BEOL layers of the 3D IC chip. In this aspect of the present disclosure, the compound semiconductor HEMT device provides high efficiency, high power density, and wideband power amplifier (PA) capability. In addition, a single crystal (X) aluminum nitride (X-AlN) film, having a high electro-mechanical coupling coefficient ($kt^2$) is provided for implementing the X-BAW acoustic filter. The high thermal conductivity X-AlN layer (e.g., Sc:AlN) works as a thermal spreader for the HEMT device and the acoustic filter device. In one configuration, a thermally conductive/electrically insulative alumina thin substrate supports the HEMT device and the acoustic filter device under high power handling conditions. In addition, face-to-face (F2F) dielectric bonding enables the HEMT device and the acoustic filter device to be transferred onto the thin alumina substrate. Use of an SiCN layer as a dielectric bond layer provides better thermal conductivity relative to traditional silicon oxide (SiOx). This configuration of the dielectric bond layer provides good thermal dissipation from the HEMT device and the acoustic filter device to the alumina substrate.

According to a further aspect of the present disclosure, a monolithic 3D integrated circuit (3D IC) chip is described. The 3D IC chip includes means for filtering integrated in the single crystal, compound semiconductor layer. The filtering means may, for example, include the acoustic device 430 and/or the single crystal bulk acoustic wave (X-BAW) filter 432 and a reflector 434, as shown in FIGS. 4-6. In another aspect, the aforementioned means may be any layer, module, or any apparatus configured to perform the functions recited by the aforementioned means.

According to additional aspects of the present disclosure, a compound semiconductor material may include, but is not limited to, gallium nitride (GaN), gallium arsenide (GaAs), indium phosphide (InP), gallium stibium (GaSb), gallium phosphide (GaP), indium gallium arsenide (InGaAs), aluminum gallium arsenide (AlGaAs), indium gallium phosphide (InGaP), aluminum gallium phosphide (AlGaP), aluminum gallium stibium (AlGaSb), indium gallium stibium (InGaSb), indium gallium nitride (InGaN), aluminum gallium nitride (AlGaN), indium gallium arsenide phosphide (InGaAsP), indium gallium arsenide stibium (InGaAsSb), or indium gallium arsenide:nitride (InGaAs:N). These are exemplary only, and other materials are possible.

Figure 8:
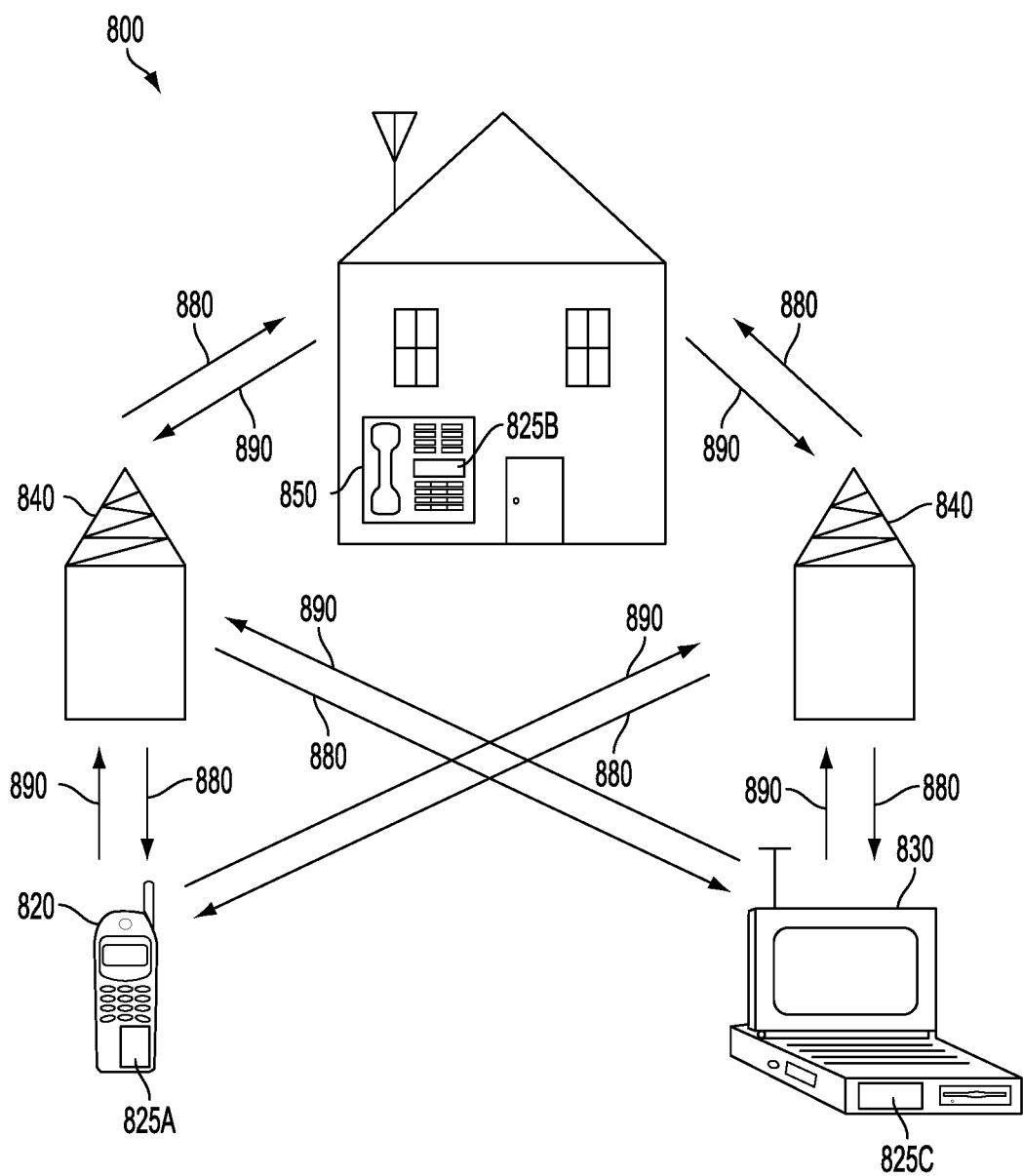
FIG. 8 is a block diagram showing an exemplary wireless communications system in which an aspect of the disclosure may be advantageously employed.

FIG. 8 is a block diagram showing an exemplary wireless communications system 800 in which an aspect of the disclosure may be advantageously employed. For purposes of illustration, FIG. 8 shows three remote units 820, 830, and 850 and two base stations 840. It will be recognized that wireless communications systems may have many more remote units and base stations. Remote units 820, 830, and 850 include IC devices 825A, 825C, and 825B that include the disclosed compound semiconductor field effect transistor. It will be recognized that other devices may also include the disclosed compound semiconductor field effect transistor, such as the base stations, user equipment, and network equipment. FIG. 8 shows forward link signals 880 from the base stations 840 to the remote units 820, 830, and 850, and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, a remote unit may be a mobile phone, a hand-held personal communications systems (PCS) unit, a portable data unit such as a personal digital assistant (PDA), a GPS enabled device, a navigation device, a set top box, a music player, a video player, an entertainment unit, a fixed location data unit such as meter reading equipment, or other communications device that stores or retrieves data or computer instructions, or combinations thereof. Although FIG. 8 illustrates remote units according to aspects of the present disclosure, the disclosure is not limited to these exemplary illustrated units. Aspects of the present disclosure may be suitably employed in many devices, which include the disclosed compound semiconductor field effect transistor.

The accompanying claims and their equivalents are intended to cover such forms or modifications as would fall within the scope and spirit of the protection. For example, the apparatuses, methods, and systems disclosed herein may be applied to multi-SIM wireless devices subscribing to multiple communications networks and/or communications technologies. The apparatuses, methods, and systems disclosed herein may also be implemented digitally and differentially, among others. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, include compact disc (CD), laser disc, optical disc, digital versatile disc (DVD), floppy disk, and Blu-ray® disc, where disks usually reproduce data magnetically, while discs reproduce data optically with lasers. Combinations of the above are also included within the scope of non-transitory computer-readable and processor-readable media. Additionally, the operations of a method or algorithm may reside as one or any combination of set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects which do not provide all of the features and advantages set forth herein, are also within the scope of this disclosure. For example, the apparatuses, methods, and systems described herein may be performed digitally and differentially, among others. Accordingly, the scope of the present disclosure is intended to be defined only by reference to the appended claims.

What is claimed is:
1. A 3D integrated circuit (3D IC) chip, comprising:
   a die including a compound semiconductor high electron mobility transistor (HEMT) active device comprising compound semiconductor layers on a single crystal, compound semiconductor layer;
   a bulk acoustic wave (X-BAW) device integrated in the single crystal, compound semiconductor layer;

an interlayer dielectric on the single crystal, compound semiconductor layer and on the compound semiconductor HEMT active device;

a reflector in the interlayer dielectric and coupled to the X-BAW device; and a passive device integrated in back-end-of-line layers of the die on the single crystal, compound semiconductor layer.

2. The 3D IC chip of claim 1, in which the compound semiconductor layers comprise gallium nitride (GaN) and aluminum gallium nitride (AlGaN) layers.

3. The 3D IC chip of claim 1, in which the single crystal, compound semiconductor layer comprises a single crystal (X) aluminum nitride (X-AlN) layer.

4. The 3D IC chip of claim 1, further comprising an air cavity in the interlayer dielectric and surrounding a portion of the reflector and the X-BAW device.

5. The 3D IC chip of claim 1, further comprising:
a substrate coupled to the interlayer dielectric, being distal from the single crystal, compound semiconductor layer.

6. The 3D IC chip of claim 5, further comprising a bond layer between the substrate and the interlayer dielectric.

7. The 3D IC chip of claim 5, in which the substrate comprises alumina ($Al_2O_3$).

8. The 3D IC chip of claim 1, in which the compound semiconductor HEMT active device comprises a heterogeneous wideband HEMT power amplifier (PA).

9. The 3D IC chip of claim 1, in which the passive device comprises a capacitor coupled to an inductor.

10. The 3D IC chip of claim 9, in which the capacitor comprises a metal-insulator-metal (MIM) capacitor and the inductor comprises redistribution layers of the back-end-of-line layers.

11. A method of making a 3D integrated circuit (3D IC) chip, comprising:
epitaxially growing a single crystal, compound semiconductor layer on a semiconductor substrate;

epitaxially growing compound semiconductor layers on the single crystal, compound semiconductor layer;

fabricating a compound semiconductor high electron mobility transistor (HEMT) active device from the compound semiconductor layers on the single crystal, compound semiconductor layer on the semiconductor substrate;

forming a bulk acoustic wave (X-BAW) device in the single crystal, compound semiconductor layer;

depositing an interlayer dielectric on the single crystal, compound semiconductor layer and on the compound semiconductor HEMT active device;

forming a reflector in the interlayer dielectric and coupled to the X-BAW device; and fabricating a passive device in back-end-of-line layers of the 3D IC chip on the single crystal, compound semiconductor layer.

12. The method of claim 11, in which epitaxially growing the single crystal, compound semiconductor layer comprises growing a single crystal (X) aluminum nitride (X-AlN) layer on the semiconductor substrate.

13. The method of claim 12, in which epitaxially growing the compound semiconductor layers comprises growing gallium nitride (GaN) and aluminum gallium nitride (AlGaN) layers on the X-AlN layer.

14. The method of claim 11, in which fabricating the passive device comprises:
depositing a first electrode and a second electrode separated by a dielectric layer to form a metal insulator metal (MIM) capacitor in a first back-end-of-line (BEOL) interlayer dielectric (ILD) layer on a backside surface of the single crystal, compound semiconductor layer;

depositing a redistribution layer on the first BEOL ILD layer to form an inductor; and interconnecting the MIM capacitor and the inductor to form the passive device.

15. The method of claim 11, further comprising:
removing the semiconductor substrate to expose a backside surface of the single crystal, compound semiconductor layer; and bonding a thermally conductive substrate to the interlayer dielectric on a front side surface of the single crystal, compound semiconductor layer and on the compound semiconductor HEMT active device.

16. The method of claim 11, further comprising forming an air cavity in the interlayer dielectric and surrounding a portion of the reflector and the X-BAW device.

* * * * *